(12) United States Patent
Crowley

(10) Patent No.: US 6,184,746 B1
(45) Date of Patent: Feb. 6, 2001

(54) PLL POWER SUPPLY FILTER (WITH PUMP) HAVING A WIDE VOLTAGE RANGE AND IMMUNITY TO OXIDE OVERSTRESS

(75) Inventor: Matthew P. Crowley, San Jose, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/374,065

(22) Filed: Aug. 13, 1999

(51) Int. Cl.[7] .......................................... H03B 1/00
(52) U.S. Cl. ........................ 327/551; 327/552; 327/532; 327/157; 331/17
(58) Field of Search .................... 327/551, 552, 327/532, 157; 331/17

(56) References Cited

U.S. PATENT DOCUMENTS 5,999,039 * 12/1999 Holst et al. ........................... 327/532

* cited by examiner

Primary Examiner—Kenneth B. Wells
Assistant Examiner—Cassandra Cox
(74) Attorney, Agent, or Firm—Skjerven Morrill MacPherson LLP; Stephen A. Terrile; Margaret M. Kelton

(57) ABSTRACT

A power supply filter capable of functioning with low power supply voltages includes a resistor-capacitor circuit coupled to a power supply line and a transistor for providing power to a target circuit, such as a phase-locked loop circuit, coupled between the resistor-capacitor circuit and the power supply line. The resistor-capacitor circuit is coupled to a charge pump controller to keep the transistor in a saturation state. The charge pump controller receives at least one clock signal that is coupled to at least one capacitive circuit. The at least one capacitive circuit includes at least two capacitors in series with a biased middle node located between the at least two capacitors in order to provide immunity to time dependent dielectric breakdown, the middle node coupled to approximately half the power supply line. A method of filtering noise from a power supply includes providing an N-channel source follower circuit coupled between the power supply and a target circuit, the N-channel source follower circuit including a resistor-capacitor circuit and a transistor with a threshold voltage. The method also includes maintaining the transistor in a saturation state through placing a charge pump in the N-channel source follower circuit, the charge pump receiving a first clock signal and a second clock signal, and allowing the voltage provided to a target circuit to exceed the voltage of the power line minus the threshold voltage while maintaining the transistor in a saturation state.

24 Claims, 5 Drawing Sheets

PLL POWER SUPPLY FILTER (WITH PUMP) HAVING A WIDE VOLTAGE RANGE AND IMMUNITY TO OXIDE OVERSTRESS

BACKGROUND OF THE INVENTION

1. Field of the Invention

The invention generally relates to power supply filters. More particularly, the present invention relates to power supply filters used in phase-locked loop circuits.

2. Description of the Related Art

An important part of any computer system is the microprocessor. Today's microprocessors are continually improved to increase the speed and lower the voltages at which computer systems operate. As the execution speed of microprocessors has reached and exceeded 200 MHz and continues to increase, the importance of maintaining a high fidelity timing signal becomes increasingly important.

Microprocessors typically use a clock distribution system to supply timing signals to the various microprocessor operating circuits. The clock distribution system buffers timing signals and supplies timing signals having a suitably accurate frequency and duty cycle and minimum phase error. In high speed microprocessors, the accuracy of frequency and duty cycle reproduction becomes increasingly important. One technique for supplying an accurate timing signal involves generation of a clock signal by a phase-locked loop (PLL) and distribution of the clock signal over the large area of the integrated circuit, while maintaining the clock skew to a specified tolerance throughout that area.

A highly accurate timing signal is achieved by ensuring a constant power supply to the PLL and strict limitation of noise to the voltage-controlled oscillator (VCO) within the PLL. Noise in the power supply to the VCO results in jitter that greatly reduces the effective frequency of which the processor can operate. Present day and future microprocessor operating speeds are only attained if the noise in the power supply is highly limited.

Conventional integrated circuits typically use an RC filter to attenuate the power supply noise on an external dedicated VDD line coming into the integrated circuit chip dedicated VDD for the PLL. The RC filter typically includes a variable resistor or potentiometer element for manually adjusting the characteristics of the filter. One problem with conventional integrated circuits and RC filters is that the PLL circuit typically has dual countermanding requirements of a high voltage requirement and a large amount of filtering to the input power supply voltage. A suitable RC filter for the demands of power supply filtering uses a large resistance and typically a large capacitance. The large resistance causes a voltage drop that reduces the power supply level. Thus, only small resistor values are usable which makes the RC filtering ineffective.

Thus, a drawback of current power supply filters is that they fail to provide adequate filtering at lower VDD voltages because the resistance needs to be small. What is needed is a power supply filter that functions at low power supply voltages.

SUMMARY OF THE INVENTION

Accordingly, a power supply filter capable of functioning with low power supply voltages is presented. The power supply filter includes a resistor-capacitor circuit coupled to a power supply line and a transistor for providing power to a target circuit, such as a phase-locked loop circuit, coupled between the resistor-capacitor circuit and the power supply line. The resistor-capacitor circuit is coupled to a charge pump controller to keep the transistor in saturation. The charge pump controller receives at least one clock line that is coupled to at least one capacitive circuit. The at least one capacitive circuit includes at least two capacitors in series with a middle node located between the at least two capacitors in order to provide immunity to time dependent dielectric breakdown, the middle node coupled to a second power supply line that supplies approximately (within 10% of) half the power supply line voltage.

Also presented is a method of filtering noise from a power supply. The method includes providing an N-channel source follower circuit coupled between the power supply and a target circuit, the N-channel source follower circuit including a resistor-capacitor circuit and an N-MOSFET with a threshold voltage. The method also includes maintaining the transistor in a saturation state through placing a charge pump in the N-channel source follower circuit, the charge pump receiving a first clock signal and a second clock signal, and allowing the voltage provided to a target circuit to exceed the voltage of the power line minus the threshold voltage while maintaining the transistor in a saturation state.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

As described above, power supplies providing power to computer system components cause noise in sensitive analog circuits. One type of sensitive analog circuit is a phase-locked loop circuit. Phase-locked loop circuits are important in microprocessor design for their ability to multiply an external bus clock frequency and to synchronize the rising edge between an external bus clock and a microprocessor clock. The noise from a power supply affects the phase-locked loop circuit, causing undesirable jitter in the processor clock that it produces. This jitter causes the rising edge alignment to become uncertain and results in timing problems within the system.

Figure 1:
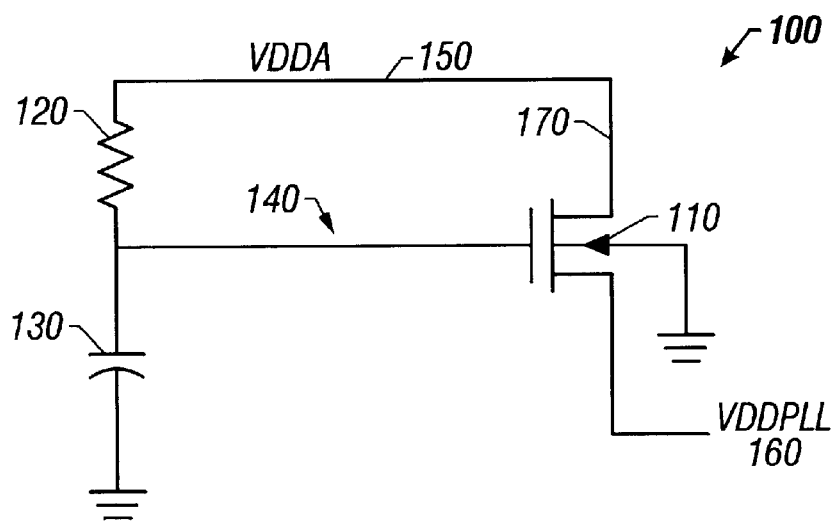
FIG. 1 represents an N-channel source follower power supply filter.

A typical power supply filter for computer systems that is effective at reducing noise is an N-channel source follower power supply filter shown in FIG. 1. This type of filter is very effective at rejecting supply noise over a wide frequency band and in applications that use sensitive analog circuits, such as phase-locked loop circuits.

FIG. 1 demonstrates a power supply filter in which the voltage supplied to sensitive analog circuitry is controlled. The working principal of FIG. 1 is to keep the device saturated such that the source voltage is only a function of the gate voltage 140 of N-MOSFET 110 and not the drain voltage 170 such that there is no dependence on the drain voltage 170. This allows a resistor-capacitor circuit, shown as resistor 120 and capacitor 130 coupled to gate 140 to control the output voltage of the power supply, shown as "VDDPLL" 160. With resistor 120 and capacitor 130 chosen to provide a large time constant (R*C), the source voltage will follow the gate voltage and reject noise on the drain node (VDDA) because of the large RC time constant on the gate 140.

As long as the N-MOSFET 110 remains in saturation, the source voltage will depend on the gate voltage and not the drain voltage. An N-MOSFET operates in saturation when Vgs, the voltage between the gate and the source, is greater than or equal to the threshold voltage, Vt, and the drain voltage does not fall below the gate voltage by more than the threshold voltage. Due to the dependencies of the VDDPLL on the threshold voltage, the power supply filter shown in FIG. 1 becomes difficult to implement if there is a drop in voltage output from the power supply VDDA 150. A lower VDDA 150 causes a lower VDDPLL. Due to a lower VDDA, a body effect improves. The body effect causes a threshold voltage ($V_{TN}$) to increase. It is caused by the NMOS source voltage being greater than the bulk material voltage of the N-MOSFET 110 ($V_{SB}$>0).

Figure 2:
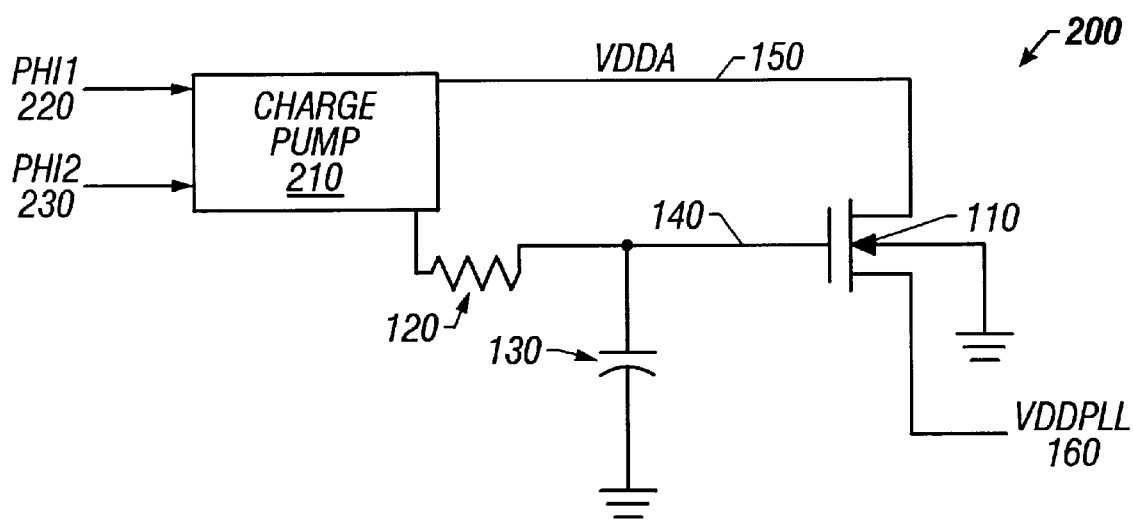
FIG. 2 is a schematic drawing of an N-channel source follower power supply filter including a pump and dual phase non-overlapping clocks in accordance with an embodiment of the present invention.

Referring now to FIG. 2, a schematic shows a generalized embodiment of the present invention, namely, a power supply filter 200 that compensates for the $V_{TN}$ drop at low VDDA voltages. The power supply filter 200 is shown with a "charge pump" 210 coupled between the VDDA 150 and the resistor-capacitor circuit, with resistor 120 and capacitor 130. The charge pump operates to boost the voltage at the gate 140 of the N-MOSFET 110 to make up for the loss in the N-MOSFET 110 threshold voltage. Given the relationship between the saturation state and the gate voltage, the charge pump 210 must not cause the gate voltage to become sufficiently higher than the drain voltage, otherwise the N-MOSFET 110 enters triode-region operation. Accordingly, N-MOSFET 110 is chosen such that the drain to source voltage at which saturation occurs, (Vdsat), is approximately 100 mV or less. This provides an upper limit of: Vtn−Vdsat+δ over the VDDA 150 voltage as the voltage to which the gate voltage can be pumped to insure saturation of the N-MOSFET 110.

Figure 3:
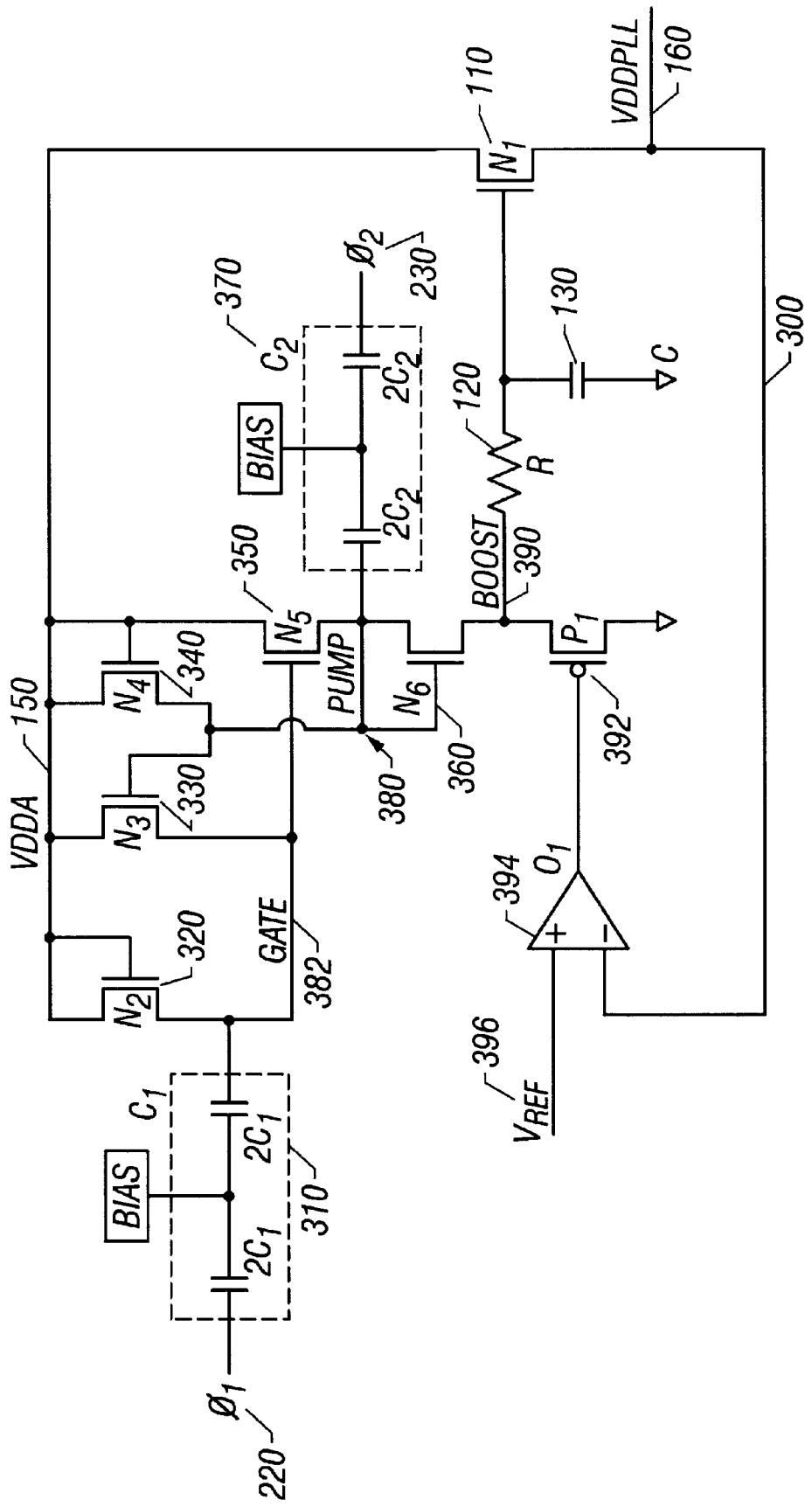
FIG. 3 is a schematic drawing of a power supply filter showing electrical components of a pump in accordance with an embodiment of the present invention.

The basic design shown in FIG. 2 can be implemented in a number of ways, as one skilled in the art would recognize. The following descriptions show two particular embodiments that provide a wider voltage range and immunity to oxide breakdown. Referring now to FIG. 3, a schematic describes one embodiment of the present invention. FIG. 3 shows a design that uses a common dual phase pump architecture represented by phase signals Phi1 220 and Phi2 230, which are also shown in FIG. 2, as non-overlapping clocks.

The operation of the common dual-phase pump embodiment is described. When Phi1 220 transitions up by ΔV volts, capacitor 310 pumps the node labeled "GATE" 382 up by ΔV volts. Thus, the GATE 382 has a voltage of VDDA 150+ΔV volts. This turns on the N-MOSFET N5 350 and charges node PUMP 380 to VDDA 150, assuming ΔV volts is much greater than the threshold voltage of the N-MOSFET N5 350. When Phi1 220 transitions low, N-MOSFET 350 turns off, thereby leaving node PUMP 380 charged at VDDA 150. N-MOSFET N2 320 insures that node GATE 382 does not discharge below VDDA 150−Vtn volts.

Next, Phi2 230 transitions up by ΔV volts and node PUMP 380 is pushed up by ΔV volts via capacitor $C_2$ 370. N-MOSFET N3 330 turns on when PUMP 380 rises one Vtn above VDDA 150, thus clamping node GATE 382 at the voltage of VDDA 150, and N-MOSFET N5 350 remains off. Node BOOST 390 follows node PUMP 380 through source follower N-MOSFET N6 360. Thus, although the voltage at BOOST 390 is one Vtn below the voltage at PUMP 380, the PUMP node 380 is driven by ΔV volts, which is set to be much greater than one Vtn. The voltage at BOOST 390 will therefore exceed the voltage VDDA 150 and the output voltage VDDPLL 160 can be charged to a voltage that is higher than VDDA−Vtn.

The P-MOSFET 392 and the operational amplifier 394 represent a regulation circuit that forms a feedback loop that regulates the current flow out of the BOOST node 390. The feedback regulates the output voltage VDDPLL 160 in order to match the VREF node 396. By using a feedback loop, VDDPLL 160 may be boosted above its typical value of VDD−Vtn. Further, using a feedback loop controls the operation of N-MOSFET 110 and whether N-MOSFET 110 remains in saturation. With the power supply filter shown in FIG. 3, VDDPLL 160 can be 100 to 200 mV below the power supply voltage VDDA 150 with N-MOSFET 110 remaining in the saturation region.

Figure 4:
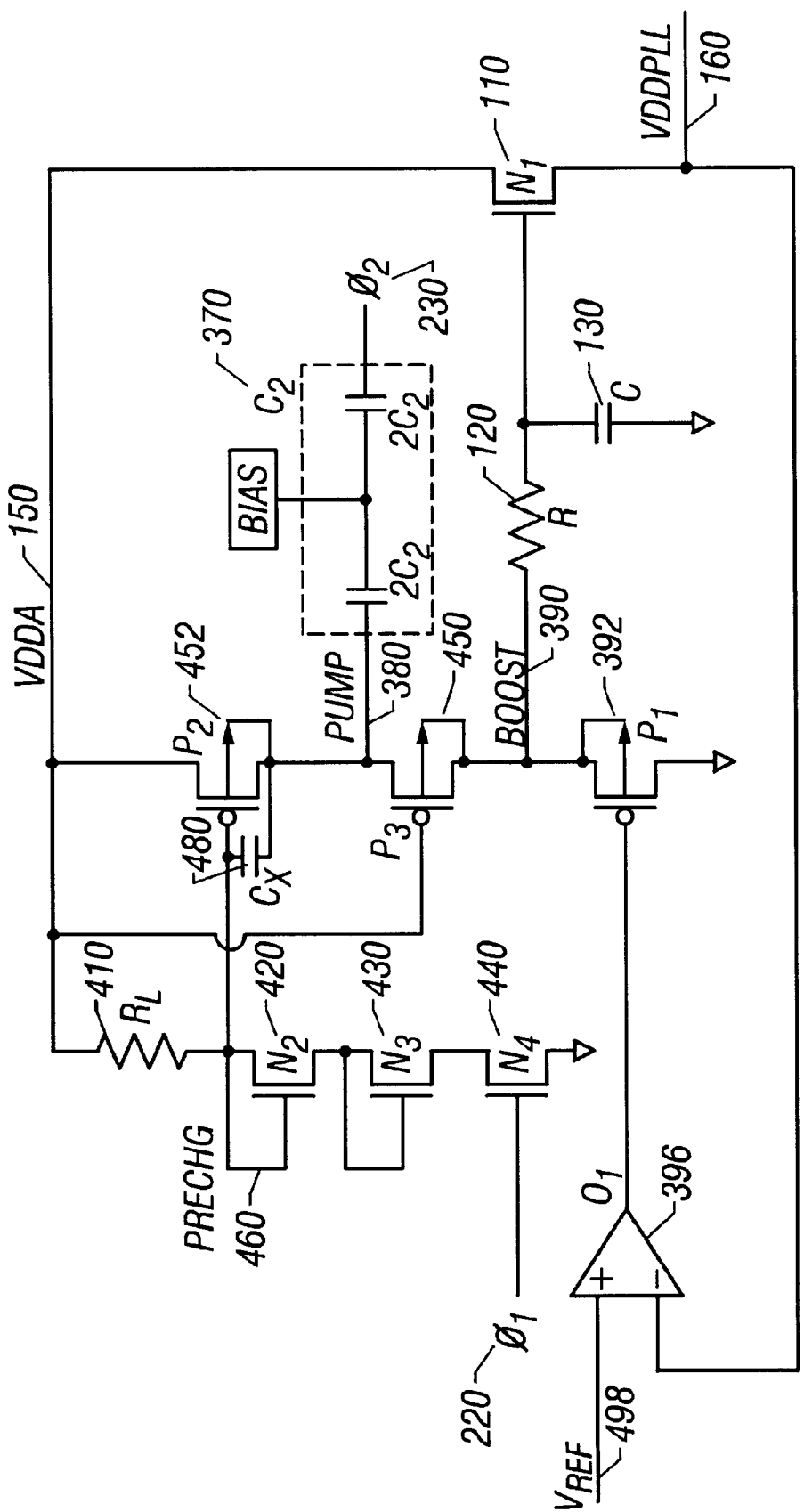
FIG. 4 is a schematic drawing of a power supply filter showing electrical components of a pump that uses fewer capacitors in accordance with another embodiment of the present invention.

FIG. 4 is a schematic representation of another embodiment of the present invention. Referring to FIG. 3 and FIG. 4 in combination, the power supply filter represented in FIG. 4 (PSF4) differs from the power supply filter represented in FIG. 3 (PSF3) in several significant respects. Moreover, PSF4 overcomes drawbacks found in the PSF3. One such drawback is related to time dependent dielectric breakdown (TDDB) caused by momentary stress across the gate oxide of N-MOSFET 350 of PSF3 during transitions between Phi1 and Phi2. For example, when Phi2 transitions down by ΔV volts, node PUMP 380 is pulled down to VDDA−Vtn. When Phi1 transitions up by ΔV volts, the gate-to-source voltage of N-MOSFET 350 increases causing a momentary stress across the gate oxide. Such periodic stress can cause the oxide to punch through the transistor, posing a serious time dependent dielectric breakdown (TDDB). In deep submicron designs in which the oxides are thin and do not tolerate oxide voltage stress, PSF3 could cause such TDDB.

Additionally, PSF3 uses two pump capacitors, each of which are split into two capacitors, C1 310 and C2 370. To avoid TDDB failure when each phase switches between low and high, each capacitor is shown in PSF3 as two capacitors in series. As those skilled in the art appreciate, replacing two capacitors with the series equivalent requires quadruple the area for each capacitor so replaced. PSF4 saves space by using a different circuit design, discussed below.

A third problem found in PSF3 is that the charge pump produces a Vtn drop in a transistor in the charge pump, shown as N-MOSFET 360. Thus, the charge pump must work harder to produce a voltage at node BOOST 390 that is higher by the threshold voltage drop caused by N-MOSFET 360.

The above-stated problems are rectified in PSF4. Referring now to PSF4, the same dual phase non-overlapping clocks Phi1 220 and Phi2 230 are shown. This time, however, Phi1 220 is directly coupled to an N-MOSFET, 440, which turns on when Phi1 220 transitions high. When N-MOSFET 440 turns on, node PRECHG 460 is pulled down to a voltage of approximately two times the threshold voltage. Upon node PRECHG 460 reaching 2*Vtn, P-MOSFET 452 turns on and precharges node PUMP 380 to VDDA 150. The TDDB on P-MOSFET 452 problem is avoided at the node PRECHG 460 because the node does not reach zero volts or ground. When Phi1 220 transitions down by ΔV volts, N-MOSFET 440 transitions off, allowing the load resistor 410 coupled to the PRECHG node 460 to be pulled up to VDDA 150 and thereby turning off P-MOSFET 452. Unlike PSF3, PSF4 uses a P-MOSFET 452 coupled between the power source and the PUMP node 380. This prevents the momentary stress across the gate oxide caused by transitions between Phi1 220 and Phi2 230, thereby avoiding serious time dependent dielectric breakdown (TDDB).

Referring now to PSF3, Phi2 230 boosts the pump voltage from VDDA 150 by increasing the voltage at PUMP 380. The amount that Phi2 230 boosts the pump voltage is ΔV volts. In PSF4, however, when PUMP 380 reaches VDDA+ |Vtp|, where Vtp represents the threshold voltage of a P-MOSFET transistor, the P-MOSFET 450 turns on due to the source-to-gate voltage of P-MOSFET 450 reaching |Vtp|. This causes a charge to be injected into the BOOST node 390. When P-MOSFET 452 turns on, the PUMP node 380 is clamped to a voltage of VDDA+|Vtp|. Should a higher voltage be required at the node PUMP 380, an optional capacitor, shown as Cx 480 can be added, which will drive the gate of P-MOSFET 452 up in voltage along with the source voltage and insure that the P-MOSFET 452 remains off.

Referring to both PSF3 and PSF4 in combination, one skilled in the art will appreciate that PSF4 provides a significantly more efficient charge pump. To get the voltage at the BOOST node 390 of PSF4, node PUMP 380 need only go to VDDA+|Vtp|. In PSF3, however, to get BOOST node 390 to VDDA+$V_{TN}$, PUMP 380 must go to VDDA+2*$V_{TN}$. Thus, PSF4 is more efficient.

When Phi2 230 transitions down by ΔV volts, the voltage at node PUMP 380 is pulled down to slightly below VDDA 150. The next Phi1 220 cycle precharges PUMP 380 back to VDDA 150 and the cycle repeats.

Operational amplifier 396 in combination with P-MOSFET 392 form a regulation circuit that produces a high gain feedback loop that modulates the voltage at node BOOST 390. The operational amplifier 396 receives the VDDPLL 160 voltage at the inverting input and the VREF 498 voltage at the noninverting input. The feedback loop will, therefore, attempt to make VREF 498 and VDDPLL 160 match. Proper selection of the VREF 498 voltage will result in the VDDPLL 160 voltage having sufficient precision to insure that the N-MOSFET 110 remains in saturation, thereby preserving desirable filtering characteristics.

The additional circuitry in FIG. 4, in particular the pump components and the feedback components, cause a ripple effect at a frequency of two phase clock signals apparent at the node BOOST 390. However, the resistor-capacitor circuit, made up of resistor 120 and capacitor 130 placed in series with the BOOST 390 node greatly attenuates the ripple effect.

Figure 5:
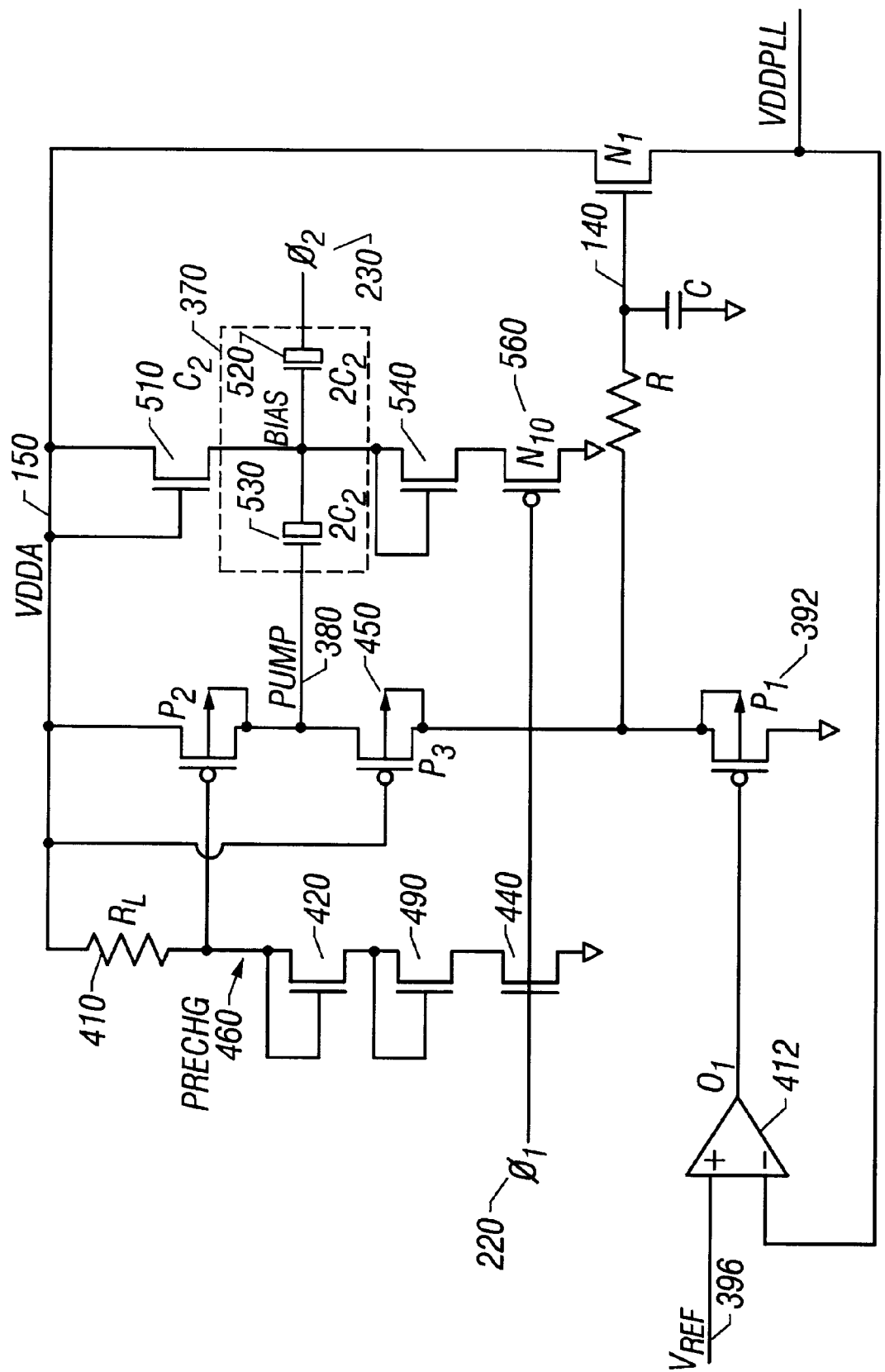
FIG. 5 is a schematic drawing of a power supply filter showing electrical components of a pump that avoids time dependent dielectric breakdown in accordance with an embodiment of the present invention.

Referring now to FIG. 5, PSF4 is shown with the biasing portion of the circuit added. As discussed above, PSF4 eliminates the time dependent dielectric breakdown problem inherent with deep submicron designs that results from high voltage stress across the capacitor oxide of capacitors created from transistors. FIG. 5 shows capacitor 370 broken into two capacitors, 530 and 520, and the middle node, BIAS 550 set to a voltage that insures proper pump operation without oxide voltage stress across 530 or 520. One skilled in the art will appreciate that when Phi1 220 is clocked high by ΔV volts, then N-MOSFET 560 will be "on" and BIAS 550 will be charged to approximately (within 10% of) half the voltage of VDDA 150. Accordingly, during the high portion of the clock cycle of Phi1 220, both capacitors 520 and 530 will be biased to approximately half the voltage of VDDA 150 because node PUMP 380 is precharged to VDDA 150 volts, BIAS 550 is approximately (within 10% of) half the voltage of VDDA, and Phi2 230 is "on". During the clock cycle of Phi2 230, N-MOSFET 560 is "off" and the BIAS 550 node is allowed to float until the Phi2 230 pump cycle begins and changes the node voltage.

Figure 6:
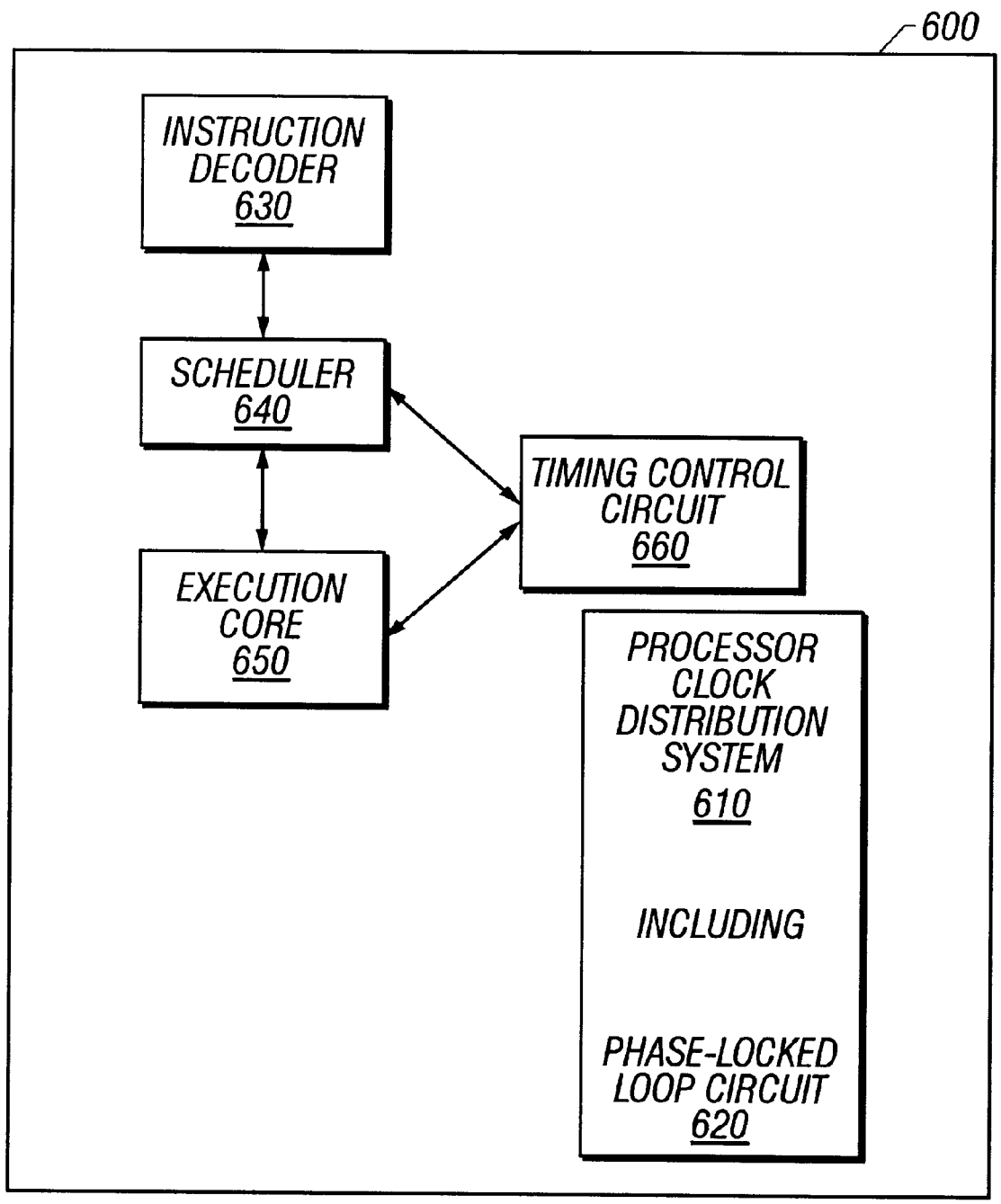
FIG. 6 illustrates an embodiment of a microprocessor in accordance with an embodiment of the present invention.

Referring now to FIG. 6, a schematic block diagram illustrates a microprocessor 600 that incorporates an embodiment. In one embodiment, flip-flop based modules (not shown) of the microprocessor 600 receive processor clock signals from a processor clock distribution system 610, which buffers and generates a clock signal that is an accurate reproduction of the frequency and duty cycle of a weakly-driven clock produced by a phase-locked loop circuit (PLL) 620. The PLL is included in the processor clock distribution system 610. The PLL receives power through a signal, PLLVDD 160, that is filtered through a power supply filter such as those represented in FIGS. 4–5.

More specifically, processor 600 includes an instruction decoder 630, a scheduler 640 connected to the instruction decoder 630, an execution core 650 including a plurality of execution units, and a timing control circuit 660 coupled to the execution core and the scheduler 640, the timing control circuit 660 including a PLL 620 coupled to a power supply filter such as the power supply filter represented in FIGS. 4–5.

Other Embodiments

In the present invention, a transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

A MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equations merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

The above description is intended to be illustrative of the invention and should not be taken to be limiting. Other embodiments within the scope of the present invention are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A power supply filter comprising:
   a resistor-capacitor circuit;
   a switch coupled between the resistor-capacitor circuit and a power supply line, the switch providing power to a target circuit;
   a charge pump coupled to the resistor-capacitor circuit and coupled to the power supply line, the charge pump keeping the switch in a saturation state;
   at least one clock line coupled to the charge pump for supplying a clock signal; and wherein said charge pump includes
   at least one capacitive circuit coupled to at least one of the at least one clock line, the at least one capacitive circuit including:
      at least two capacitors in series with a middle node located between the at least two capacitors, the middle node coupled to a second power supply line, the second power supply line having approximately half the power supply line voltage.

2. The power supply filter of claim 1 wherein the target circuit is a phase-locked loop circuit.

3. The power supply filter of claim 1 wherein the clock signal includes:
   a first non-overlapping clock signal coupled to a first of the at least one capacitive circuits; and
   a second non-overlapping clock signal coupled to a second of the at least one capacitive circuits.

4. The power supply filter according to claim 1 further comprising: a P-MOSFET circuit coupled to the power supply line and coupled to the at least one capacitive circuit, the P-MOSFET circuit including:
   a load resistor coupled to the power supply line;
   a first P-MOSFET coupled to the power supply line and coupled to the at least one capacitive circuit;
   a second P-MOSFET coupled to the at least one capacitive circuit and coupled to the resistor-capacitor circuit; and
   an N-MOSFET circuit coupled to the load resistor and coupled to one of the at least one clock line.

5. The power supply filter according to claim 4 wherein the N-MOSFET circuit includes:
   a first N-MOSFET coupled to one of the at least one clock lines;
   a second N-MOSFET coupled to the first N-MOSFET; and
   a third N-MOSFET coupled to the second N-MOSFET, the first, second and third N-MOSFETs coupled in series.

6. The power supply filter according to claim 1 wherein the switch is an N-MOSFET transistor.

7. The power supply filter according to claim 1 wherein the clock signal includes:
   at least a first non-overlapping clock signal coupled to a gate of an N-MOSFET; and
   a second non-overlapping clock signal, wherein the middle node of the at least two capacitors in series is charged to a voltage of substantially half the power supply line voltage during activation of the first non-overlapping clock signal, the middle node being charged to a floating voltage during activation of the second non-overlapping clock signal.

8. The power supply filter according to claim 1, further comprising:
   a regulation circuit coupled to the power supply line, the regulation circuit including:
      a P-MOSFET coupled to the power supply line; and
      an operational amplifier, wherein an output of the operational amplifier coupled to the gate of the P-MOSFET, and a first input to the operational amplifier coupled to the output from the power supply filter, and a second input to the operational amplifier coupled to a reference voltage.

9. The regulation circuit of claim 8, wherein the P-MOSFET and the operational amplifier form a high gain feedback loop that regulates the current flow to the resistor-capacitor circuit.

10. A method of filtering noise on a power line supplying operating power from a power supply to a target circuit, the method comprising:
    providing an N-channel source follower circuit coupled between the power supply and the target circuit, the N-channel source follower circuit including a resistor-capacitor circuit and a transistor with a threshold voltage;
    maintaining the transistor in a saturation state through placing a charge pump in the N-channel source follower circuit, the charge pump receiving a first clock signal and a second clock signal; and
    allowing the voltage provided to a target circuit to exceed the voltage of the power line minus the threshold voltage while maintaining the transistor in a saturation state.

11. The method of claim 10 further comprising:
    charging a first node by a voltage provided by the first clock signal;
    preventing the first node from discharging below the voltage of the power line minus a threshold voltage; and
    charging a second node by a voltage provided by a second non-overlapping clock signal;

clamping the first node to the voltage of the power line when the voltage of the second node rises above the voltage of the power line by the threshold voltage; and allowing a third node to charge to a voltage exceeding the power line voltage.

12. The method of claim 10 further comprising:

applying the first clock signal to a first capacitive circuit; and applying the second clock signal to a second capacitive circuit, the first capacitive circuit and the second capacitive circuit including:

at least two capacitors in series with a middle node located between the at least two capacitors, the middle node coupled to a biasing voltage source.

13. The method of claim 10 further comprising:

providing a regulation circuit to keep the N-channel source follower circuit in saturation, the regulation circuit including:

a P-MOSFET coupled to the resistor-capacitor circuit; and an operational amplifier, the output of the operational amplifier coupled to a gate of the P-MOSFET, and a first input to the operational amplifier coupled to an output from the N-channel source follower circuit, and a second input to the operational amplifier coupled to a reference voltage; and modulating the voltage of the node coupled to the resistor-capacitor circuit with a high gain feedback loop provided by the regulation circuit to match the reference voltage to the output from the N-channel source follower circuit.

14. The method of claim 10 wherein the target circuit is a phase-locked loop circuit.

15. The method of claim 10 further comprising:

applying the first clock signal to a first capacitive circuit, the first capacitive circuit including:

at least two capacitors in series with a middle node located between the at least two capacitors, the middle node coupled to biasing voltage source; and applying the second clock signal to a N-MOSFET circuit.

16. The method of claim 15 wherein the N-MOSFET circuit includes:

a first N-MOSFET coupled to one of the at least one clock signals;

a second N-MOSFET coupled to the first N-MOSFET; and a third N-MOSFET coupled to the second N-MOSFET, the first, second and third N-MOSFETs coupled in series.

17. A processor comprising:

an instruction decoder;

a scheduler coupled to the instruction decoder;

an execution core including a plurality of execution units; and a timing control circuit coupled to the execution core and the scheduler, the timing control circuit including a phase-locked loop circuit coupled to a power supply filter, the power supply filter including:

a resistor-capacitor circuit coupled to a power supply line;

a transistor coupled between the resistor-capacitor circuit and the power supply line;

a charge pump coupled to the resistor-capacitor circuit to keep the transistor in a saturation state;

at least one clock signal coupled to the charge pump; and at least one capacitive circuit coupled to at least one of the at least one clock signal, the at least one capacitive circuit including at least two capacitors in series with a middle node located between the at least two capacitors, the middle node coupled to a second supply line, the second supply line providing approximately half the voltage of the power supply line.

18. The processor of claim 17, wherein the at least one clock signal includes:

a first clock signal coupled to a first of the at least one capacitive circuits; and a second clock signal coupled to a second of the at least one capacitive circuits.

19. The processor of claim 17, wherein the power supply filter further includes:

a P-MOSFET circuit coupled to the power supply line and coupled to the at least one capacitive circuit, the P-MOSFET circuit including:

a load resistor coupled to the power supply line;

a first P-MOSFET coupled to the power supply line and coupled to the at least one capacitive circuit;

a second P-MOSFET coupled to the at least one capacitive circuit and coupled to the resistor-capacitor circuit; and an N-MOSFET circuit coupled to the load resistor and coupled to one of the at least one clock signals.

20. The processor of claim 19, wherein the N-MOSFET circuit includes:

a first N-MOSFET coupled to one of the at least one clock signals;

a second N-MOSFET coupled to the first N-MOSFET; and a third N-MOSFET coupled to the second N-MOSFET, the first, second and third N-MOSFETs coupled in series.

21. The processor of claim 17, wherein the transistor is an N-MOSFET.

22. The processor of claim 17, wherein the at least one clock signal includes:

a first non-overlapping clock signal coupled to a gate of an N-MOSFET, a second non-overlapping clock signal wherein the middle node of the at least two capacitors in series charged to a voltage of substantially half the power supply line voltage during activation of the first non-overlapping clock signal, the middle node being charged to a floating voltage during activation of the second non-overlapping clock signal.

23. The processor of claim 17, wherein the power supply filter further includes:

a regulation circuit coupled to the power supply line, the regulation circuit including:

a P-MOSFET coupled to the power supply line; and an operational amplifier, the output of the operational amplifier coupled to the gate of the P-MOSFET, and a first input to the operational amplifier coupled to the output from the power supply filter, and a second input to the operational amplifier coupled to a reference voltage.

24. The processor of claim 23 wherein the P-MOSFET and the operational amplifier form a high gain feedback loop that regulates the current flow to the resistor-capacitor circuit.

* * * * *

UNITED STATES PATENT AND TRADEMARK OFFICE
CERTIFICATE OF CORRECTION

PATENT NO.    : 6,184,746
DATED         : February 6, 2001
INVENTOR(S)   : Crowley, Matthew P.

Page 1 of 1

It is certified that error appears in the above-identified patent and that said Letters Patent is hereby corrected as shown below:

Col. 8, Line 32, delete the entire line.

Signed and Sealed this

Fifth Day of June, 2001

*Attest:*

NICHOLAS P. GODICI

*Attesting Officer*

*Acting Director of the United States Patent and Trademark Office*